United States Patent
Rogers

(10) Patent No.: US 9,185,820 B2
(45) Date of Patent: Nov. 10, 2015

(54) MONOLITHICALLY INTEGRATED RF SYSTEM AND METHOD OF MAKING SAME

(71) Applicant: HARRIS CORPORATION, Melbourne, FL (US)

(72) Inventor: John E. Rogers, Vero Beach, FL (US)

(73) Assignee: Harris Corporation, Melbourne, FL (US)

( * ) Notice: Subject to any disclaimer, the term of this patent is extended or adjusted under 35 U.S.C. 154(b) by 333 days.

(21) Appl. No.: 13/710,527

(22) Filed: Dec. 11, 2012

(65) Prior Publication Data
US 2014/0160706 A1   Jun. 12, 2014

(51) Int. Cl.
| | |
|---|---|
| H05K 7/06 | (2006.01) |
| H05K 13/00 | (2006.01) |
| H05K 1/16 | (2006.01) |
| H01P 5/08 | (2006.01) |
| H05K 1/02 | (2006.01) |
| H05K 3/46 | (2006.01) |

(52) U.S. Cl.
CPC ........ H05K 7/06 (2013.01); H01P 5/085 (2013.01); H05K 1/16 (2013.01); H05K 13/0023 (2013.01); *H05K 1/0221* (2013.01); *H05K 1/0239* (2013.01); *H05K 3/467* (2013.01); *H05K 2203/061* (2013.01)

(58) Field of Classification Search
CPC ..... H05K 1/16; H05K 1/0221; H05K 1/0239; H05K 7/06; H05K 3/467; H05K 5/85; H05K 13/0023; H05K 2203/061; H01P 5/085
USPC ............................... 361/765; 228/176; 333/33
See application file for complete search history.

(56) References Cited

U.S. PATENT DOCUMENTS

| | | | |
|---|---|---|---|
| 6,232,847 B1 * | 5/2001 | Marcy et al. .................. | 331/167 |
| 7,012,489 B2 | 3/2006 | Sherrer et al. | |
| 7,184,272 B1 * | 2/2007 | Harlacher et al. ............ | 361/729 |
| 7,456,698 B2 * | 11/2008 | Gianchandani et al. ...... | 331/154 |
| 7,898,356 B2 | 3/2011 | Sherrer et al. | |
| 2004/0104449 A1 | 6/2004 | Yoon et al. | |
| 2007/0039828 A1 | 2/2007 | Cohen et al. | |
| 2008/0240656 A1 | 10/2008 | Rollin et al. | |

OTHER PUBLICATIONS

Sundaram, A., et al., "MEMS-Based Electronically Steerable Antenna Array Fabricated Using PCB Technology", Journal of Microelectromechanical Systems, vol. 17, No. 2, Apr. 2008, pp. 356-262.

International Search Report and Written Opinion mailed Mar. 20, 2014 in International Appln. No. PCT/US2013/073377 of Harris Corporation (11 pages).

* cited by examiner

*Primary Examiner* — Stephen E Jones
*Assistant Examiner* — Scott S Outten
(74) *Attorney, Agent, or Firm* — Robert J. Sacco; Carol E. Thorstad-Forsyth; Fox Rothschild LLP

(57) ABSTRACT

Radio frequency system (250) which includes a first and second sub-assembly (100, 200), each formed of a plurality of layers of conductive material (504, 508, 516) disposed on a substrate (102) and arranged in a stack. The stacked layers form signal processing components (108, 110) and at least one peripheral wall (104, 204) surrounding a walled area (118, 218) of each substrate. The second sub-assembly is positioned on the first sub-assembly with a first walled area of a first substrate aligned with a second walled area of a second substrate.

12 Claims, 12 Drawing Sheets

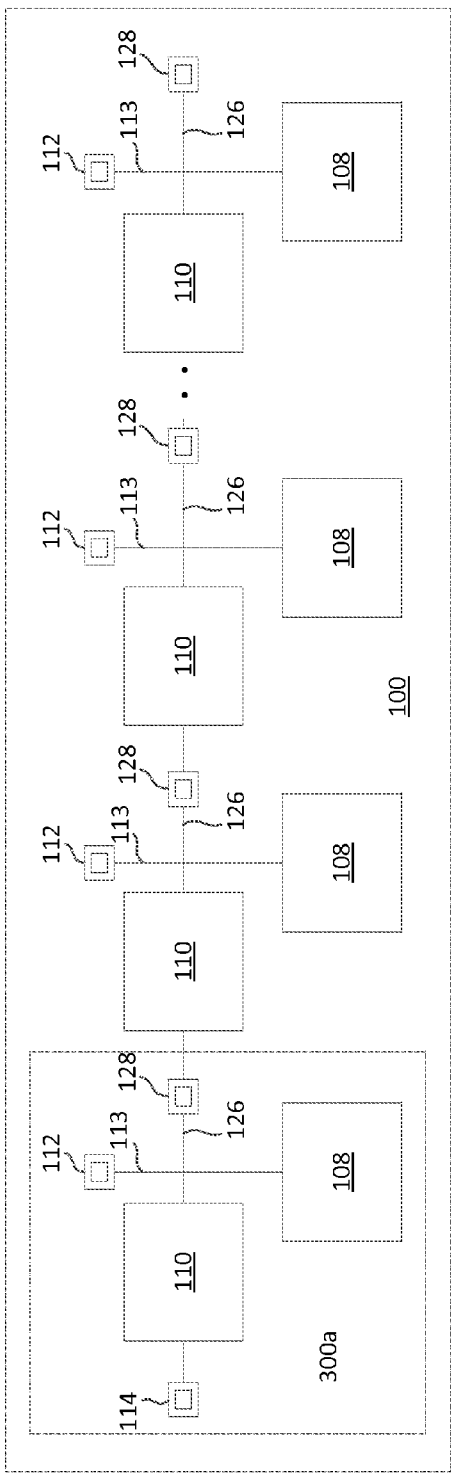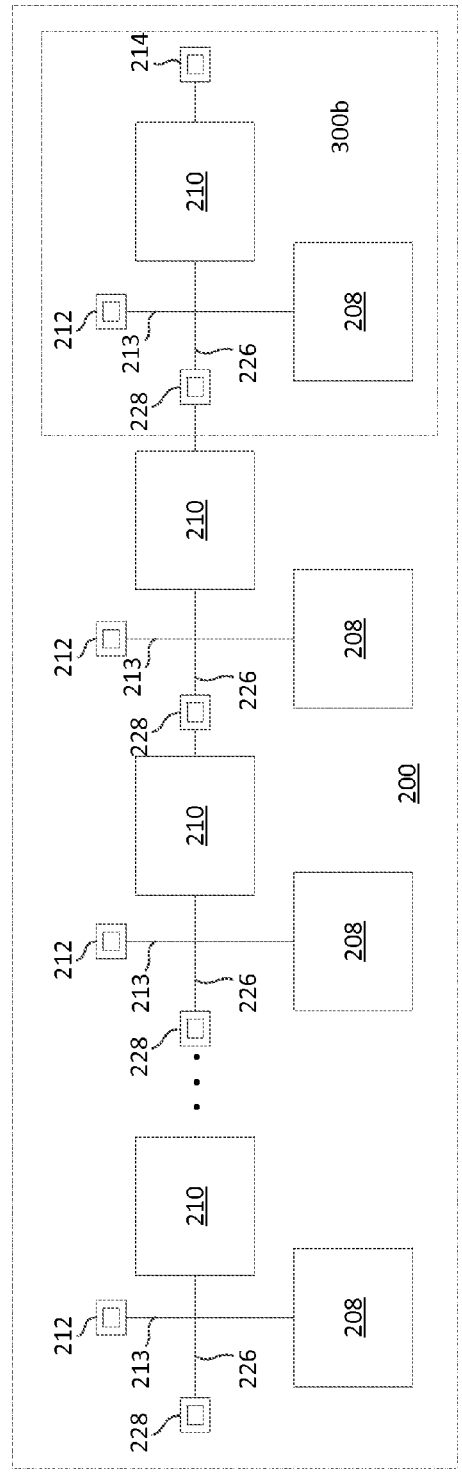

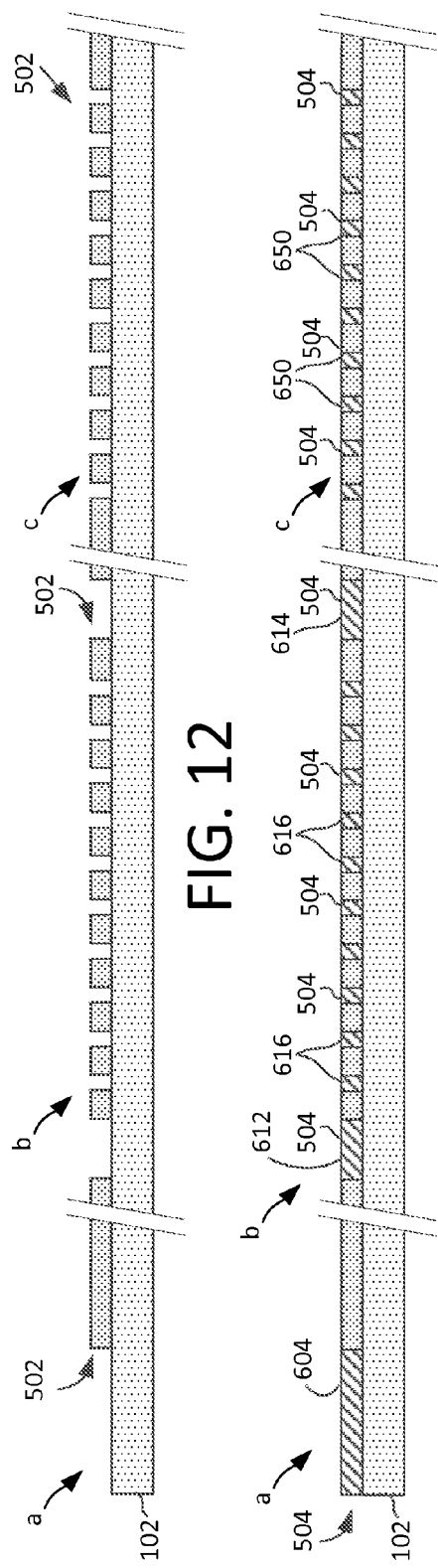
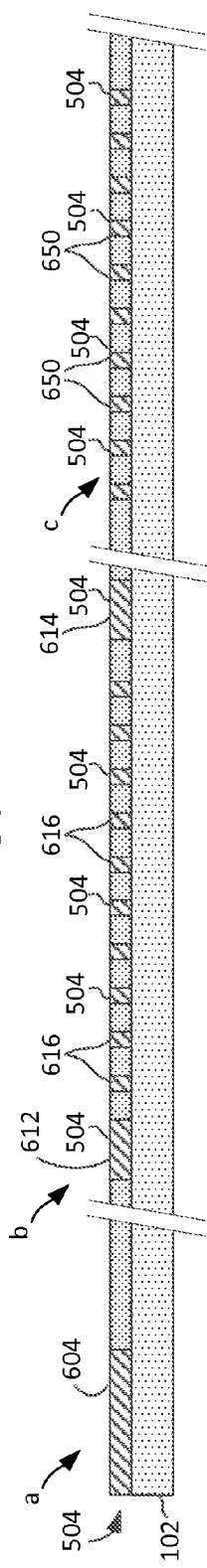
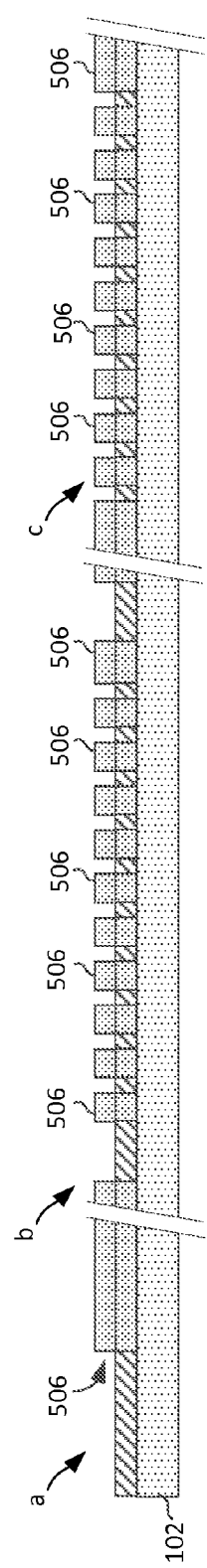
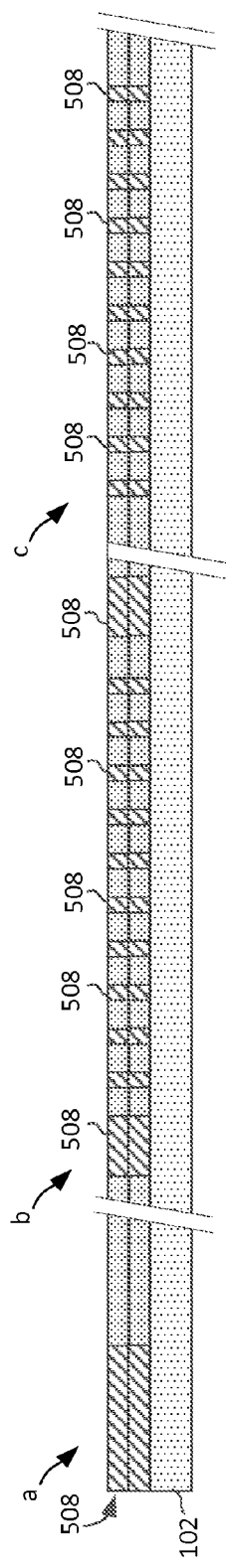
FIG. 12
FIG. 13
FIG. 14
FIG. 15

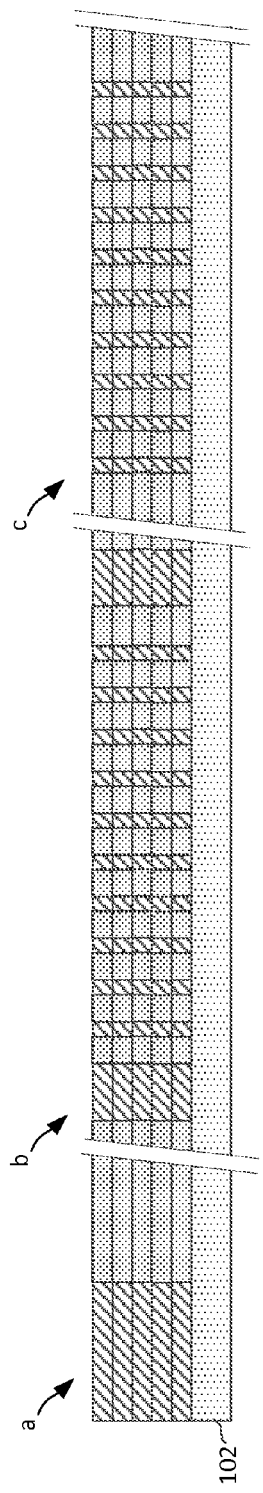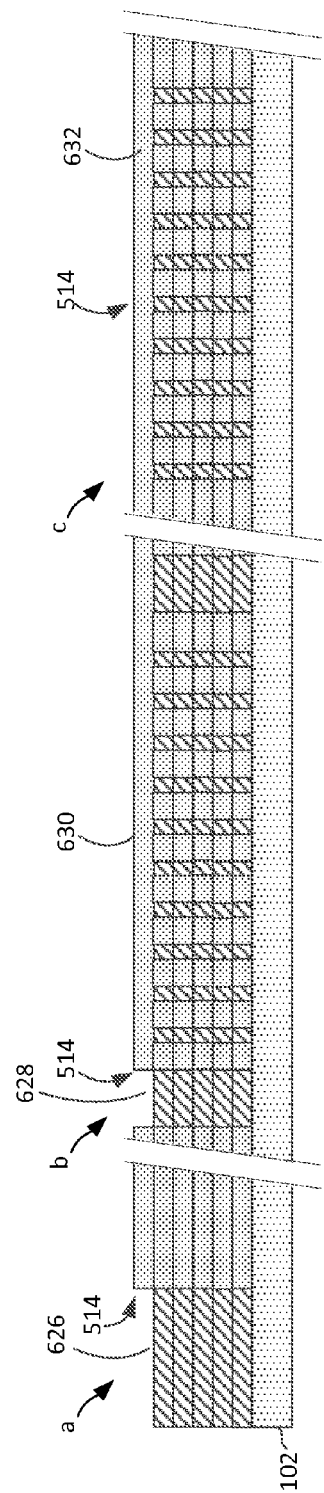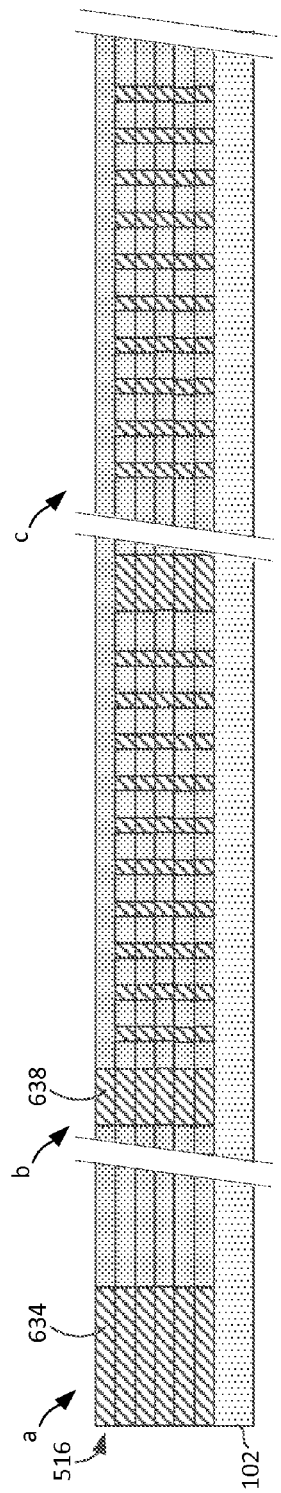

MONOLITHICALLY INTEGRATED RF SYSTEM AND METHOD OF MAKING SAME

BACKGROUND OF THE INVENTION

1. Statement of the Technical Field

The inventive arrangements relate to radio frequency (RF) electronic systems and more particularly to RF systems for microwave and millimeter wave communications which provide excellent performance, ease of manufacture and a small footprint.

2. Description of the Related Art

Many communication systems operate in high frequency bands. For example, communication systems operating at frequencies as high as 300 GHz are known. RF signal processing for these signals requires various components such as filters and switching devices. However, existing arrangements for high frequency (e.g. 10 GHz to 300 GHz) RF systems are known to suffer from certain limitations. For example conventional filters and switching systems designed for such frequencies are often based on thin film technology. Such designs tend to have relatively low power handling capability. Moreover, thin film designs also suffer from performance degradation as frequency increases.

Three-dimensional microstructures can be formed by utilizing sequential build processes. For example, U.S. Pat. Nos. 7,012,489 and 7,898,356 describe methods for fabricating coaxial waveguide microstructures. These processes provide an alternative to traditional thin film technology, but also present new design challenges pertaining to their effective utilization for advantageous implementation of various RF devices.

SUMMARY OF THE INVENTION

The invention concerns a method for constructing an RF device. The method includes forming a first sub-assembly by first depositing on a first surface of a first substrate a first plurality of layers including at least one layer each of a conductive material and a sacrificial material. A deposition of the first plurality of layers is controlled to form on the first surface at least a first peripheral wall surrounding a first walled area of the first substrate. The first peripheral wall extends a predetermined distance away from the first surface to form a first ledge. The deposit of the plurality of layers is further controlled to form at least a first signal processing component disposed on the first surface of the first substrate within the walled area. The method continues by forming a second sub-assembly. The formation of the second sub-assembly involves depositing on a second surface of a second substrate a second plurality of layers. The second plurality of layers includes at least one layer each of the conductive material and the sacrificial material. The deposition of the second plurality of layers is controlled to form on the second surface a second signal processing component within a second walled area. The second sub-assembly is then positioned on the first sub-assembly and the two sub-assemblies are joined together.

The invention also concerns a radio frequency system which includes a first and second sub-assembly. The first sub-assembly includes a first plurality of layers of conductive material disposed on a first surface of a first substrate and arranged in a first stack. The stacked layers form at least a first peripheral wall surrounding a first walled area of the first substrate. The first peripheral wall extends a predetermined distance away from the first surface to form a first ledge. The stacked layers also form at least a first signal processing component disposed on the first surface of the first substrate within the walled area. The second sub-assembly includes a second plurality of layers of conductive material disposed on a second surface of a second substrate. The second plurality of layers are arranged in a second stack to form at least a second signal processing component disposed within a second walled area. The second sub-assembly is positioned on the first sub-assembly and the two sub-assemblies are joined together.

BRIEF DESCRIPTION OF THE DRAWINGS

Embodiments will be described with reference to the following drawing figures, in which like numerals represent like items throughout the figures, and in which:

FIGS. 11A and 11B show how the signal processing components in FIGS. 1-4 can be cascaded in a system.

FIGS. 12-21 are a series of drawings which show a process for constructing the sub-assembly shown in FIGS. 1-4.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 1:
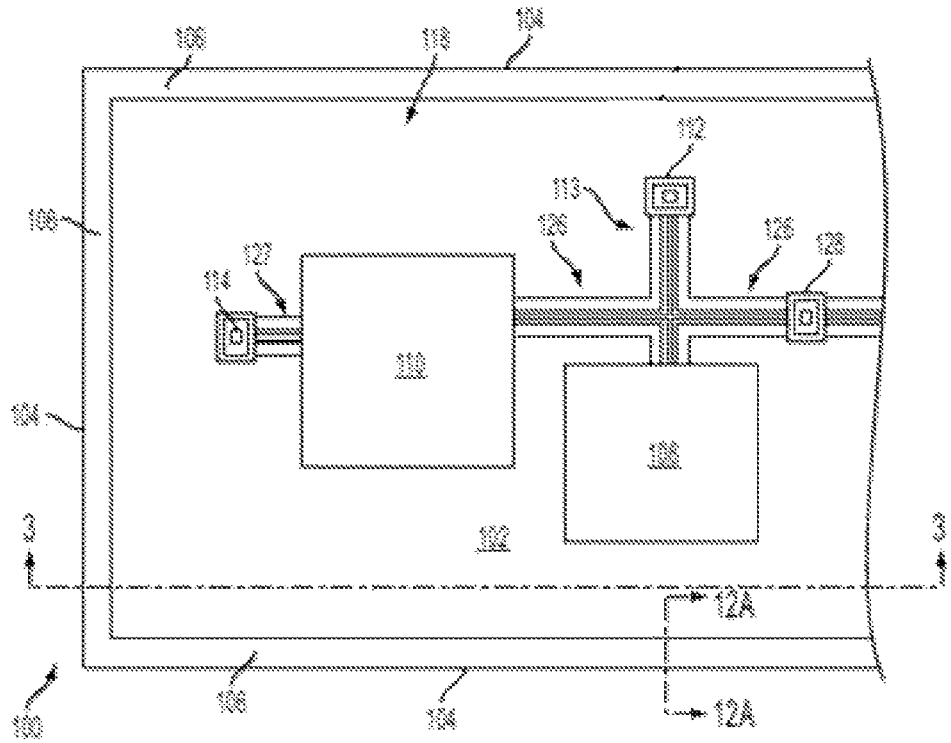
FIG. 1 is a top view of a first sub-assembly formed on a substrate that is useful for understanding the invention.
Figure 3:
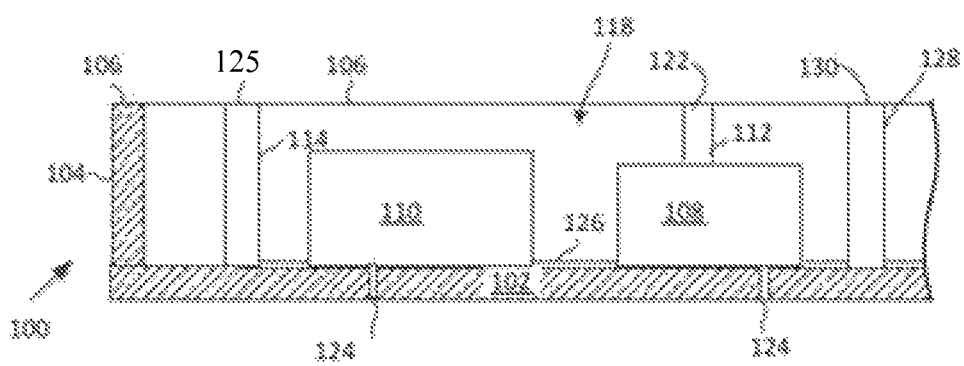
FIG. 3 is a cross-sectional view of the first sub-assembly taken along line 3-3 in FIG. 1.

There is shown in FIG. 1 a top view of a portion of a first sub-assembly 100 formed on a substrate 102. A cross-sectional view of the first sub-assembly is shown in FIG. 3. The first sub-assembly is formed by depositing on a first surface of the substrate 102 a plurality of layers (not shown in FIGS. 1 and 3). The layers are formed of a conductive material and a sacrificial material. In some embodiments, at least one of the layers is also formed of a dielectric material as described below. A deposit of the plurality of layers is controlled to form on the first surface at least a peripheral wall 104 which at least partially surrounds a walled area 118. The peripheral wall extends entirely or partially around the walled area 118. The peripheral wall can be formed of layers of dielectric material, layers of a conductive material (such as a metal) or a combination of layers formed from these materials.

The peripheral wall 104 extends transversely with respect to the surface of the substrate. More particularly, the wall extends in a direction which is normal to the surface of the substrate. The substrate extends a predetermined distance away from the surface of the substrate to form a ledge 106. The deposit of the plurality of layers is further controlled to form one or more signal processing components 108, 110 disposed on the surface of the substrate 102 within the walled area. One or more interconnecting elements is formed from the layers during this process. For example, these interconnecting elements include grounded coplanar waveguide (GCPW) sections 113, 126, and 127 and coaxial transmission line elements 112, 114, 128. Portions of the interconnecting elements extend in a direction away from (i.e., normal to) the surface of the substrate. For example, coaxial transmission line elements 112, 114, and 128 are shown as extending away from the surface of the substrate. One or more conductive vias 124, are advantageously provided to carry electrical signals through the substrate 102.

Figure 2:
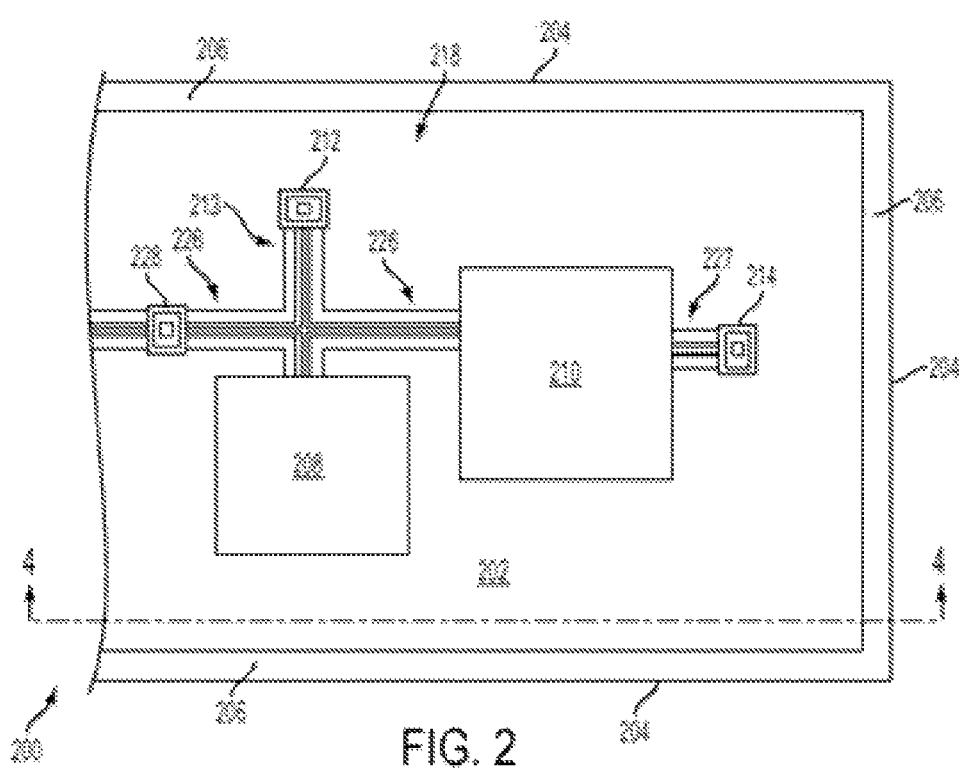
FIG. 2 is a top view of a second sub-assembly formed on a substrate that is useful for understanding the invention.
Figure 4:
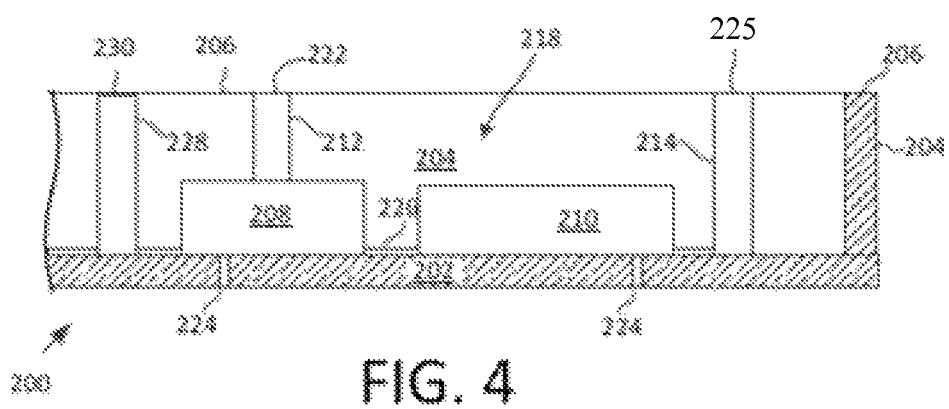
FIG. 4 is a cross-sectional view of the second sub-assembly taken along line 4-4 in FIG. 2.

As shown in FIGS. 2 and 4, a portion of a second sub-assembly 200 is also formed on a substrate 202. The second sub-assembly is formed by depositing on a second surface of the substrate 202 a plurality of layers (not shown in FIGS. 2 and 4). The layers are formed of a conductive material and a sacrificial material. In some embodiments, at least one of the layers is formed of a dielectric material as described below. A deposit of the plurality of layers is controlled to form on the second surface at least a peripheral wall 204 which at least partially surrounds a walled area 218. The peripheral wall is formed of layers of dielectric material, layers of a conductive material (such as a metal) or a combination of layers formed from these materials. As will be explained below in further detail, the peripheral wall is an optional feature with regard to the second sub-assembly and in some embodiments it can be omitted. If provided, the peripheral wall of the second sub-assembly would extend entirely or partially around the walled area 218. The peripheral wall 204 extends transversely (e.g. in a direction normal to the surface of the substrate 202). More particularly, the peripheral wall extends a predetermined distance away from the surface of substrate 202 to form a ledge 206. The deposit of the plurality of layers is further controlled to form one or more signal processing components 208, 210 disposed on the surface of the substrate 202 within the walled area.

The second sub-assembly includes one or more interconnecting elements which are formed from the material layers. The interconnecting elements can be formed concurrently with the signal processing components 208, 210 and wall 204. These interconnecting elements include GCPW 213, 226, 227 and one or more coaxial transmission line elements 212, 214, 228. Portions of the interconnecting elements can extend in a direction away from the surface of the substrate. For example, the coaxial transmission line element 212, 214, 228 can extend in a direction which is normal to the surface of the substrate 202 as shown. One or more conductive vias 224, are provided to carry electrical signals through the substrate 202. The vias within the substrate are formed using conventional methods which are well known in the art.

The substrates 102, 202 are formed from a dielectric material such as silicon (Si). The substrates 102, 202 are optionally formed from other materials, such as glass, silicon-germanium (SiGe), or gallium arsenide (GaAs) in alternative embodiments. The conductive layers forming the walls, signal processing components, interconnection elements, and any ground plane layers are each formed of a highly conductive material such as copper (Cu). Of course, other conductive materials can be used for this purpose. The dielectric layers of the sub-assembly are formed of an electrically insulating material. Acceptable dielectric materials for this purpose include polyethylene, polyester, polycarbonate, cellulose acetate, polypropylene, polyvinyl chloride, polyvinylidene chloride, polystyrene, polyamide, polyimide, and benzocyclobutene. A wide variety of other dielectric materials can be acceptable for use in forming the dielectric portions of each sub-assembly, provided that such materials are compatible with the manufacturing processes as hereinafter described. Each layer of conductive material has a thickness of between 10 μm to 50 μm. Other different ranges of layer thickness are also possible. For example, in some embodiments, the conductive material layers can range in thickness from between 50 μm to 150 μm or between 50 μm to 200 μm. The dielectric layers described herein will generally have a thickness of between 1 μm to 20 μm but can also range between 20 μm to 100 μm. The thickness and number of the layers of electrically-conductive material and dielectric material is application-dependent, and can vary with factors such as the complexity of the design, hybrid or monolithic integration of other devices with the signal processing components, the overall height ("z" dimension) of the signal processing components, and so on. The methods used to fabricate various structures described herein advantageously utilize processing techniques similar to those described in U.S. Pat. Nos. 7,013, 489 and 7,898,356, the disclosure of which is incorporated herein by reference.

Figure 7:
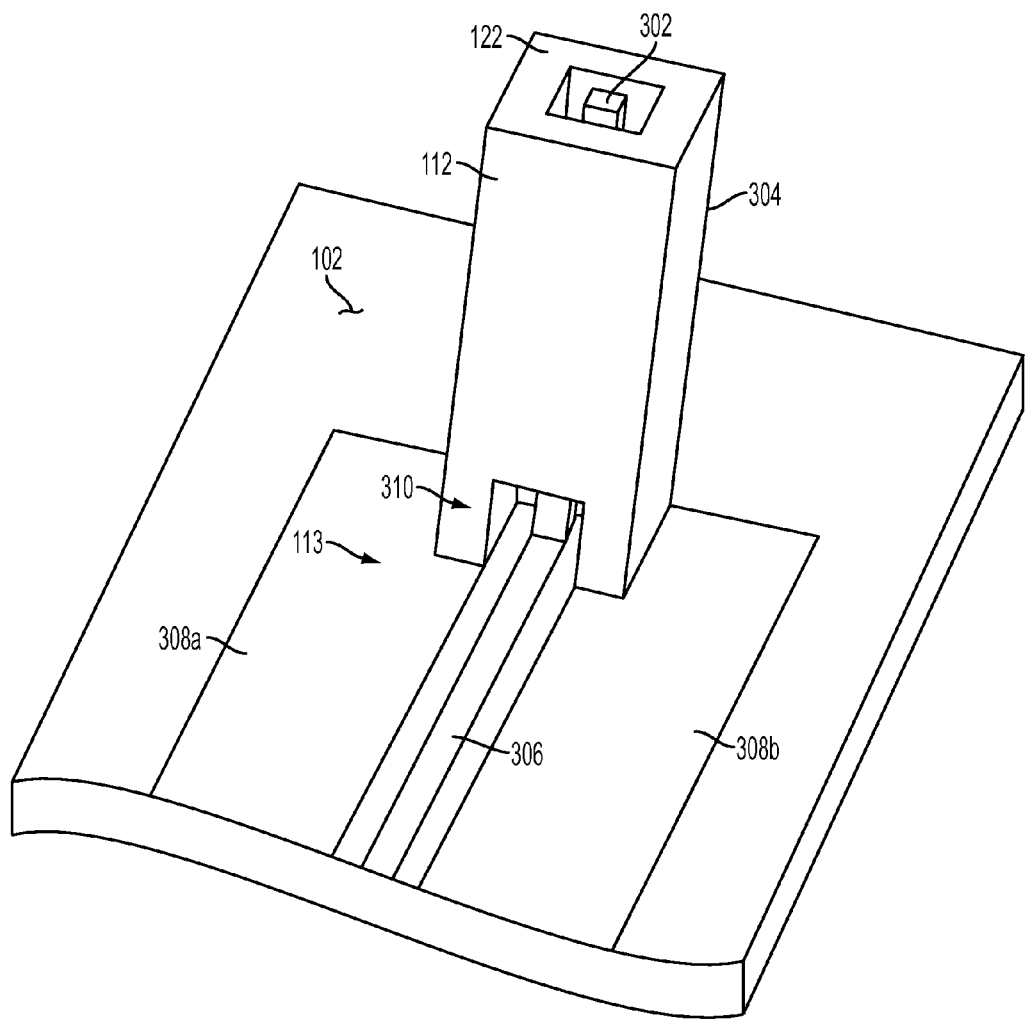
FIG. 7 is a drawing that is useful for understanding a ground to coplanar waveguide (GCPW) to coax transition which can be used in the first or second sub-assembly.

Referring now to FIG. 7 the interconnecting elements will now be described in further detail. It can be observed in FIG. 7 that an interconnecting element in the form of grounded coplanar waveguide (e.g. GCPW section 113) is disposed on a substrate (e.g. substrate 102). The GCPW type transmission line transitions to a coaxial transmission line element (e.g. transmission line element 112) at a transition 310. The GCPW section is deposited on the substrate using processing techniques similar to those described herein with respect to the peripheral wall and signal processing components. The thickness of the conductive material forming the GCPW section on the substrate can be on the order of about 1 μm to 10 μm, but other thicknesses are also possible. The coaxial transmission line element 112 is formed from a plurality of stacked layers of conductive material and a sacrificial material. These material layers are deposited using techniques as hereinafter described. The thickness of each conductive layer forming the coaxial transmission line can be about 50 μm. The GCPW section, coaxial transmission line elements and other interconnects described herein are advantageously formed concurrently with the signal processing components and peripheral wall surrounding them.

The coaxial transmission line element 112 includes an inner conductor 302 and a shield 304. The inner conductor is maintained along a central axis of the shield, spaced apart from the interior surfaces of the shield walls. The GCPW section 113 includes a center conductor 306 and coplanar ground plane portions 308a, 308b. The coaxial transmission line is disposed on the GCPW section as shown with the shield 304 in electrical contact with the ground plane portions 308a, 308b and the inner conductor 302 in contact with the center conductor 306. The transmission line extends transversely to the surface of the substrate as shown to form the transition from GCPW section to coaxial transmission line. At an end of the coaxial transmission line opposed from the surface of the substrate there is provided a face 122. Each of the coaxial transmission line elements 114, 128, 212, 214, 228 can have an overall structure, including a transition to GCPW section, which is similar to that of coaxial transmission line element 112 as described herein.

Figure 5:
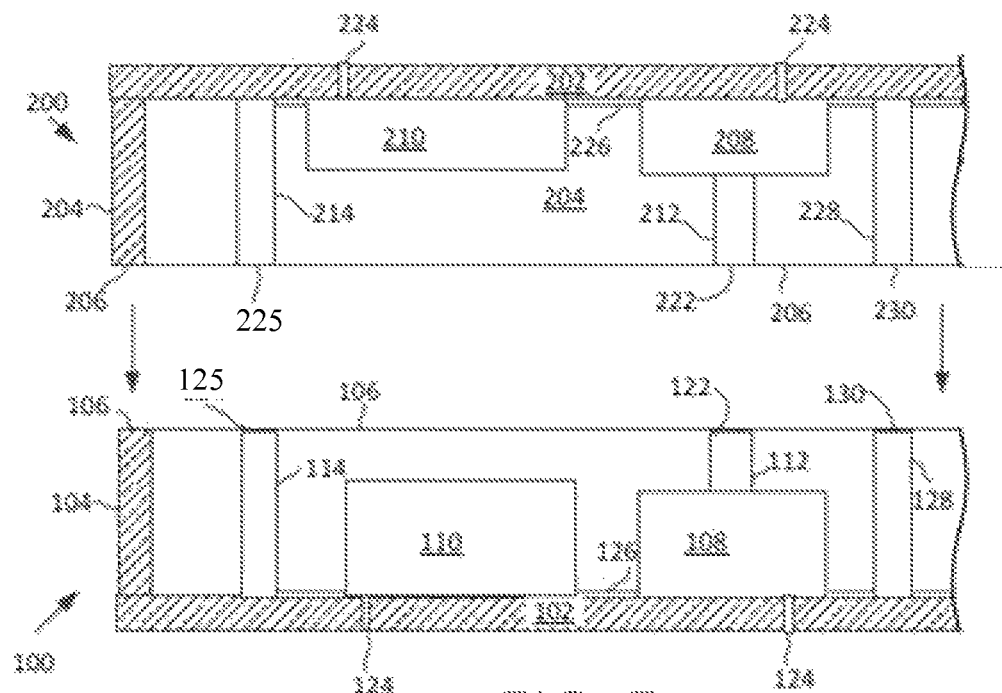
FIG. 5 is a cross-sectional view of the first and second sub-assemblies taken along lines 3-3 and 4-4 respectively, in accordance with an assembly step.
Figure 6:
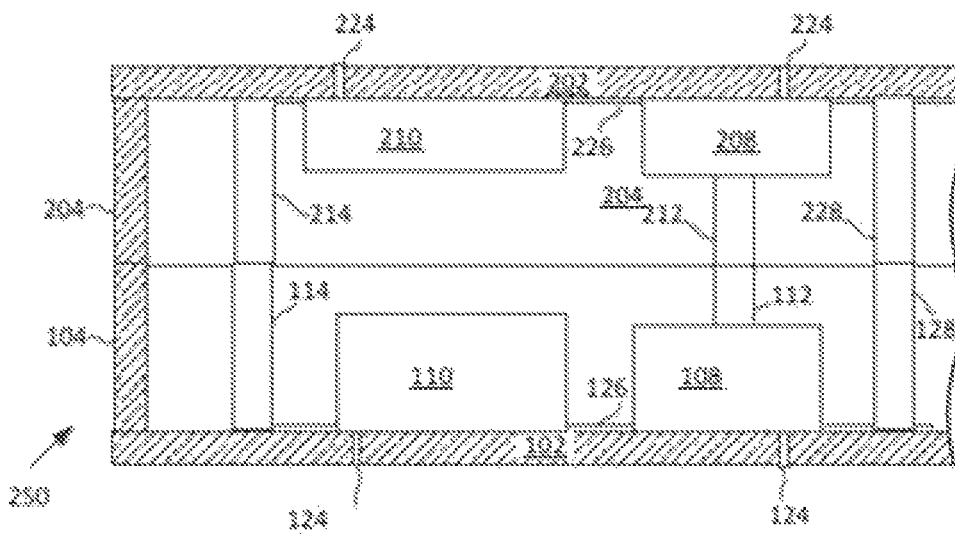
FIG. 6 shows a cross-sectional view of the first and second sub-assemblies taken along lines 3-3 and 4-4 respectively after they have been joined together, in accordance with an assembly step.

Once the first and second sub-assembly have been formed as described herein, the first and second sub-assemblies are positioned as shown in FIG. 5 so that the first walled area 118 is aligned with the second walled area 218. For example, the first surface of the first substrate is positioned so that it is facing toward the second surface of the second substrate with the first and second walled areas aligned as shown. The coaxial transmission line elements 112, 114, 128 are advantageously arranged on substrate 102 so that they are axially aligned with coaxial transmission line elements 212, 214, 228 when the two sub-assemblies are positioned as shown in FIG. 5. The two assemblies are joined together as shown in FIG. 6, by positioning the second sub-assembly 200 so that it is suspended on the ledge 106 of the first sub-assembly 100 with the first surface spaced apart from the second surface. If the second sub-assembly includes a peripheral wall 204, then the ledge 206 is positioned on the ledge 106. Similarly, a face 222, 225, 230 of each coaxial transmission line element 212, 214, 228 is respectively aligned with and positioned on a face 122, 125, 130 of each coaxial transmission line element 112, 114, 128. When arranged in this way, the faces form a coaxial electrical connection at each face. More particularly, electrical contact is formed respectively between the inner conductors and outer conductors of each coaxial transmission line element. The sub-assemblies are joined together to form a completed monolithically integrated RF circuit 250. Any suitable bonding technique can be used for the purpose of joining the two sub-assemblies including, for example, Cu—Cu bonding.

With the first and second sub-assemblies joined together as shown in FIG. 6, the peripheral walls 104, 204, and substrates 102, 202 form a housing which partially or entirely encloses the various components disposed therein. Notably, the housing is concurrently formed with the signal processing components and interconnecting elements contained therein during the same manufacturing process. A ground plane (not shown) can be disposed on some or all portions of the substrate 102, 202 which are not otherwise occupied by signal processing components and/or interconnecting elements. The ground plane portions can be electrically connected to the peripheral walls 104, 204 so that the housing functions as a shielded enclosure. A shielded enclosure can be useful in certain scenarios where it is desirable to substantially limit the egress or ingress of radiated RF signals relative to the interior of the enclosure. Also, the enclosure in some embodiments is hermetically sealed so that the atmosphere within the interior of the enclosure is isolated from an external atmosphere. This protects the interior components from dust and moisture, and permits the interior to be filled with a dielectric gas for enhanced electrical performance. Suitable insulating layers of dielectric material may be deposited as needed to isolate the ground plane from any components or interconnecting leads within the enclosure. Electrical connections are carried from the exterior of the housing to the interior of the housing by any suitable means. For example, vias 124, 224 can be used for this purpose.

Figure 8:
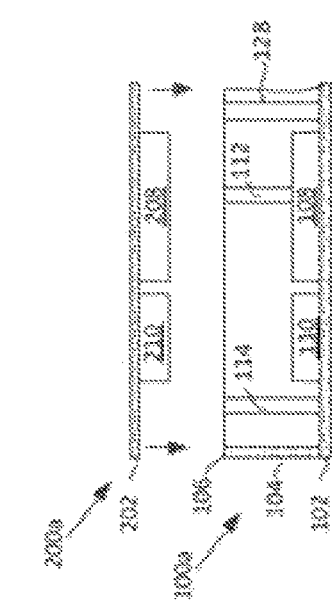
FIGS. 8A-8C show several alternative embodiments of the invention.

Several variations and/or enhancements are possible with respect to the manufacturing process shown in FIGS. 1-6. Some of these enhancements are illustrated in FIGS. 8A-8C which show variations of the first and second assembly in cross section. As shown in FIG. 8A, a second sub-assembly 200a is comprised exclusive of a peripheral wall. In such embodiments, a walled area 218 which is exclusive of a peripheral wall is aligned with a walled area 118 of a first sub-assembly 100a. The two sub-assemblies are then be joined together as previously described.

Alternatively, as shown in FIG. 8B, a second sub-assembly 200b is positioned on ledge 106 of a first sub-assembly 100b. In this embodiment, the second sub-assembly is positioned so that the substrate surface on which the signal processing components 208, 210 are formed, faces away from the substrate surface of the first sub-assembly on which the signal processing components 108, 110 are formed. Interconnects between the first sub-assembly 100b and the second sub-assembly 200b are provided at least in part by using conductive vias (not shown in FIG. 8b) which extend through the substrate 202. These vias form electrical connections with conductive traces or coaxial transmission line elements 112, 114, 128 as described herein. Also shown in FIG. 8B is a third sub-assembly 300 which is disposed on the second sub-assembly. The third sub-assembly 300 is shown to have a structure similar to the second sub-assembly 200a (which is exclusive of a peripheral wall), but could optionally have a structure similar to assembly 200 (which includes a peripheral wall).

Referring now to FIG. 8C, a third variation of the inventive arrangements is shown. In this embodiment, a first and second sub-assembly 100c, 200c are assembled in a manner similar to that described herein with respect to FIGS. 1-6. A third and fourth sub-assembly 100c' and 200c' are also assembled in a manner similar to that described herein with respect to FIGS. 1-6. A walled area of the third sub-assembly 100c' is aligned with the walled area of the second sub-assembly 200c, with the substrate surfaces on which the signal processing components are formed facing away from each other. Interconnects between the second sub-assembly 200c and the third sub-assembly 100c' are provided at least in part by using conductive vias extending through the substrates 202 and 102c. The embodiments shown in FIGS. 1-6 and 8A-8C are intended to be exemplary and other embodiments are also possible.

Signal processing components 108, 110, 208, 210 can include any signal processing component that can be formed on a substrate using the techniques described herein. As such, the signal processing components can include reactive elements such as inductors or capacitors. The signal processing components can also include RF couplers and switching elements without limitation. One or more of the signal processing components can be comprised of a MEMS device. For example, a switch can include an actuator (such as an electrostatic actuator) which can be used for opening and closing a switch contact. Another example would be a variable capacitor or varactor in which a capacitance value of the varactor can be changed by means of an actuator. Still, the invention is not limited to these signal processing components and many other such components are also possible.

Figure 9:
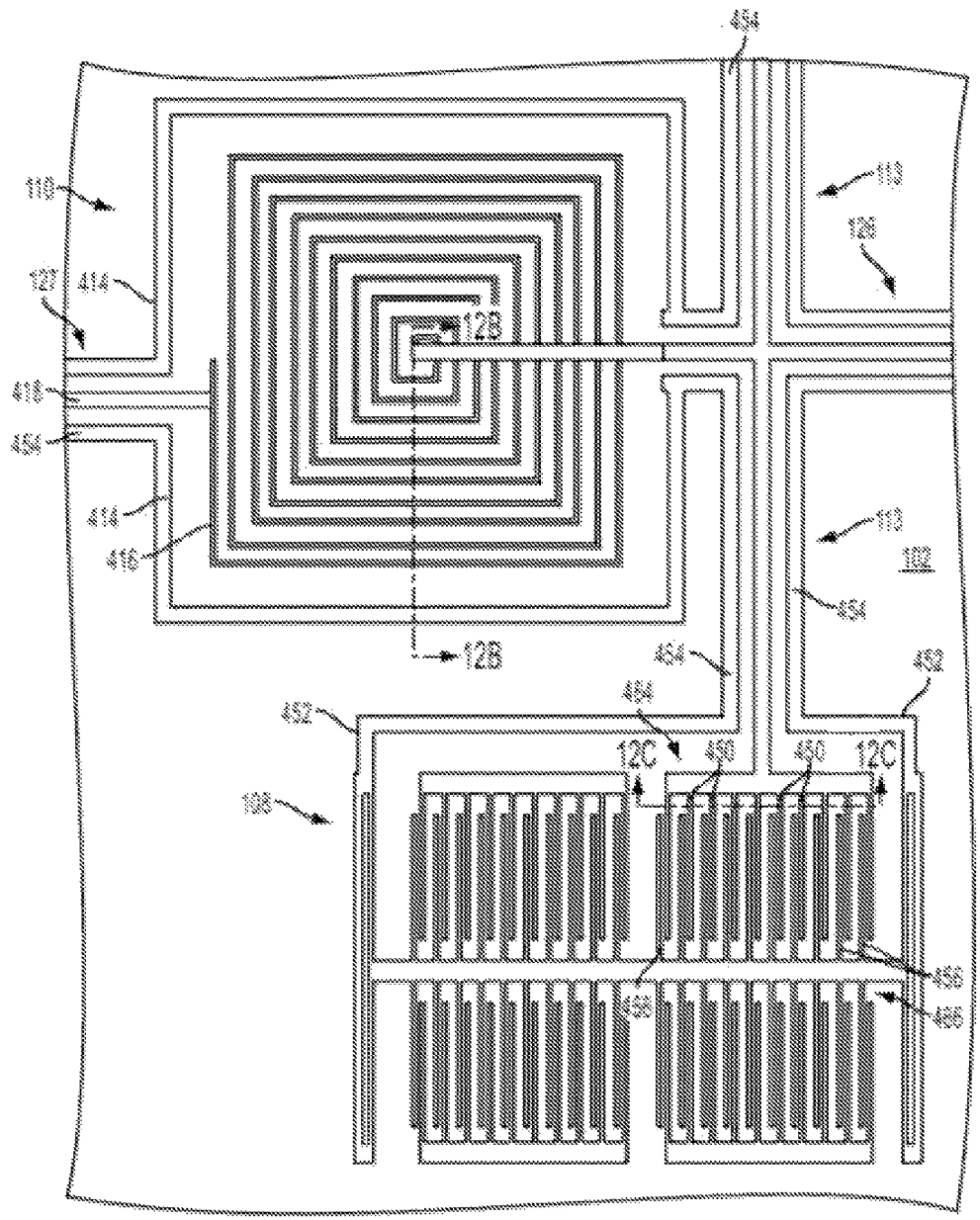
FIG. 9 is a top view of certain exemplary signal processing components which can be formed on the substrate of the first or second sub-assembly.
Figure 10A:
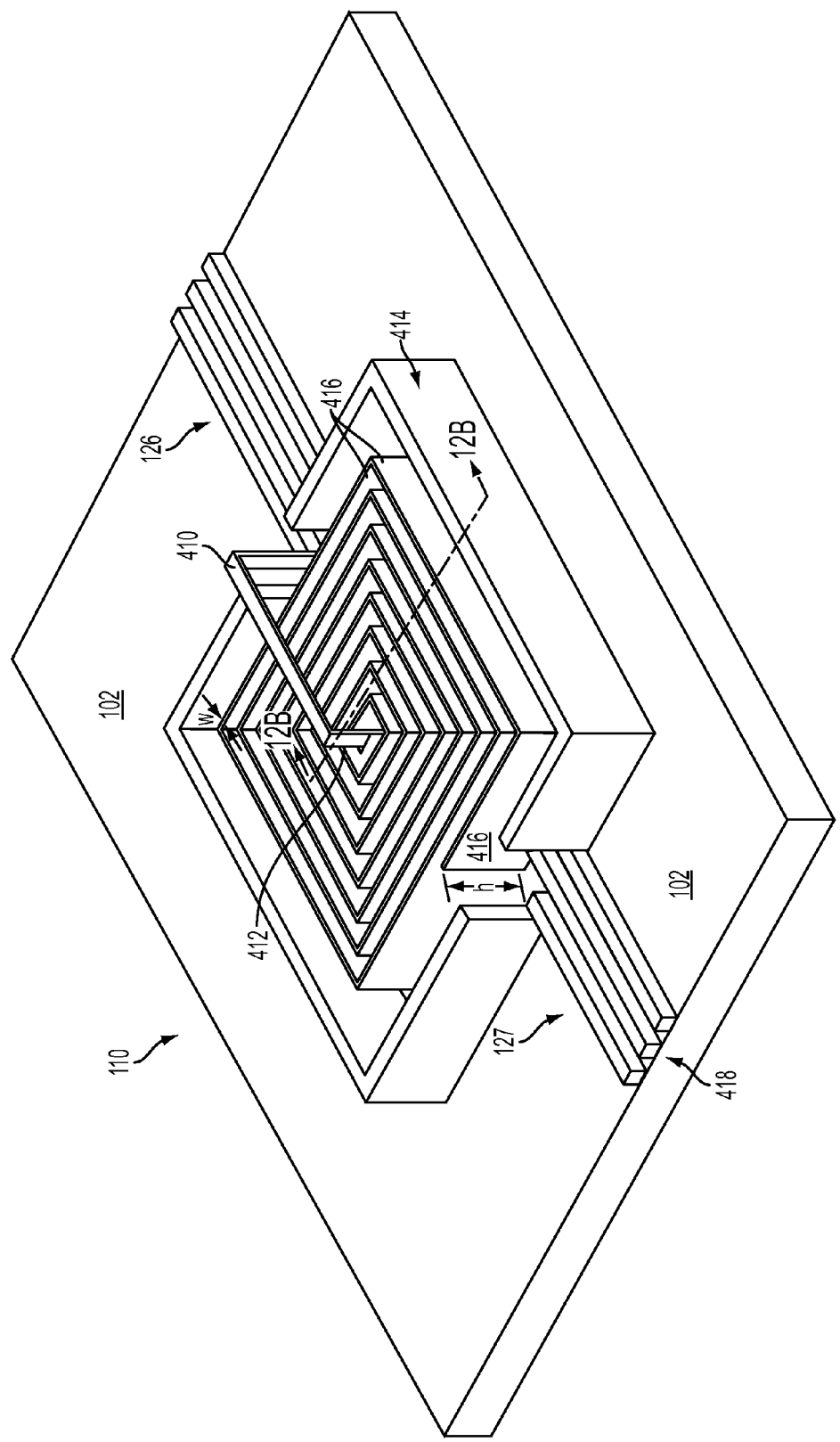
FIGS. 10A and 10B show perspective views of the exemplary signal processing components in FIG. 10.

Referring now to FIGS. 9 and 10, exemplary signal processing components 108, 110 are shown in further detail. In this example, signal processing component 108 is a varactor and signal processing component 110 is an inductor. The signal processing components in FIG. 9 are shown connected to GCPW sections 113, 126, 127 in a topology similar to that which was previously presented with respect to FIG. 1-4. In the embodiment shown, a component wall 414, 452 extends at least partially around each of the signal processing components. The component walls are connected to ground plane portion 454 of the GCPW sections 113, 126, 127.

The exemplary signal processing component 110 shown in FIG. 9 is formed of a conductive winding 416 arranged in a rectangular spiral configuration. However, any other configuration (e.g. circular spiral or meandering) can also be used without limitation. A center conductor 418 of GCPW sections 127 forms an electrical connection with the conductive winding 416. A conductive element 410 is formed as a bridge over the conductive winding to form an electrical connection with a center portion 412 of the conductive winding. A gap or clearance space provides isolation between the conductive winding 416 and the conductive element 410. The component wall 414, conductive element 410 and the conductive winding 416 are each formed of a conductor such as copper (Cu).

The conductive winding 416 has a relatively high aspect ratio. The aspect ratio is ratio of the height h of the conductive winding extending above the substrate surface, to its width w. For example, the conductive winding advantageously has an aspect ratio of up to 20:1. The actual width of the conductive winding and its height will vary with material selection and processing capabilities. However, an exemplary inductor could have a conductive winding width w of 10 μm and a winding height h of 200 μm. The component wall 414 also has a relatively high aspect ratio, but will generally have a relatively wider width as compared to the width of the conductive winding. For example, the width of the component wall 414 can be 100 μm and the height of the component wall can be 200 μm. By way of contrast, the peripheral wall (e.g. peripheral wall 104) surrounding a sub-assembly can have a width of 100 μm and a height of 300 μm. It is advantageous for the height of the peripheral wall to exceed the height of the signal processing elements disposed on the substrate so as to provide a clearance space between the signal processing element and any sub-assembly structure disposed on the top ledge of the peripheral wall. The coupling between sub-assemblies is also a function of the height difference and therefore should be considered when determining the height of the wall.

The exemplary signal processing component 108 shown in FIG. 9 is a varactor. The operation of the varactor will be described in more detail with respect to FIGS. 9 and 10B. The signal processing element 108 includes a component wall 452 which is electrically connected to the ground plane portion 454 of GCPW section 113. The varactor includes comb portions comprising shuttle 464 and truss 466 each formed of a conductive material, such as copper (Cu). Each comb portion includes one or more fingers 450, 456 formed of a conductive material and having a height b. The fingers are advantageously interdigitated so that a portion of the fingers of length l are overlapped and separated by a distance $x_0$, $y_0$ as shown. In an exemplary embodiment, the distance $x_0$ is 10 μm, the distance $y_0$ is 25 μm, each finger can have an overall length of 400 μm and an overlap l of 300 μm, a width of each tooth is 10 μm and each tooth has a height of 200 μm. Of course, the invention is not limited in this regard.

With the arrangement as shown and described herein, a capacitance is established between the conductive fingers of the interdigitated comb portions. The comb portions are advantageously formed concurrently with component wall 452, peripheral wall 104 and other signal processing elements as described herein. One or more of the comb elements as described herein is preferably moveable. For example, the truss 466 can be moveable in the direction indicated by the arrow 468 in FIG. 10B. If one or more of the comb elements are moveable as shown, their movement is effected by one or more actuators that are also formed on the substrate utilizing processing techniques similar to those described herein. For example, an electrostatic actuator can be used for this purpose. A varactor as contemplated herein can have a structure and operation similar to that which is described in U.S. Patent publication 2011/0188168 A1, the disclosure of which is incorporated herein by reference. However, the fabrication of such device is preferably conformed to the processing techniques described herein so that the varactor is formed concurrently with the peripheral wall and any other signal processing components included in the sub-assembly.

In FIGS. 1-4, 9 and 10 only two signal processing components were shown in each sub-assembly. For example, sub-assembly 100 was shown to include signal processing components 108, 110. Similarly, sub-assembly 200 was shown to include signal processing components 208, 210. However, the invention is not intended to be limited in this regard and more or fewer signal processing components can be included in each sub-assembly. For example, in some embodiments of the invention, it can be advantageous to cascade a plurality of signal processing components to create devices of greater complexity. This concept is illustrated in FIGS. 11A and 11B. In some embodiments, a plurality of components can form a module (e.g. modules 300a, 300b) and the same module (or modules having a similar topology) can be cascaded as shown. Such an arrangement can be advantageous for certain RF filter applications. Accordingly, the sub-assemblies 100, 200 as described herein can in some embodiments have an arrangement similar to that shown in FIGS. 11A and 11B.

Figure 10B:
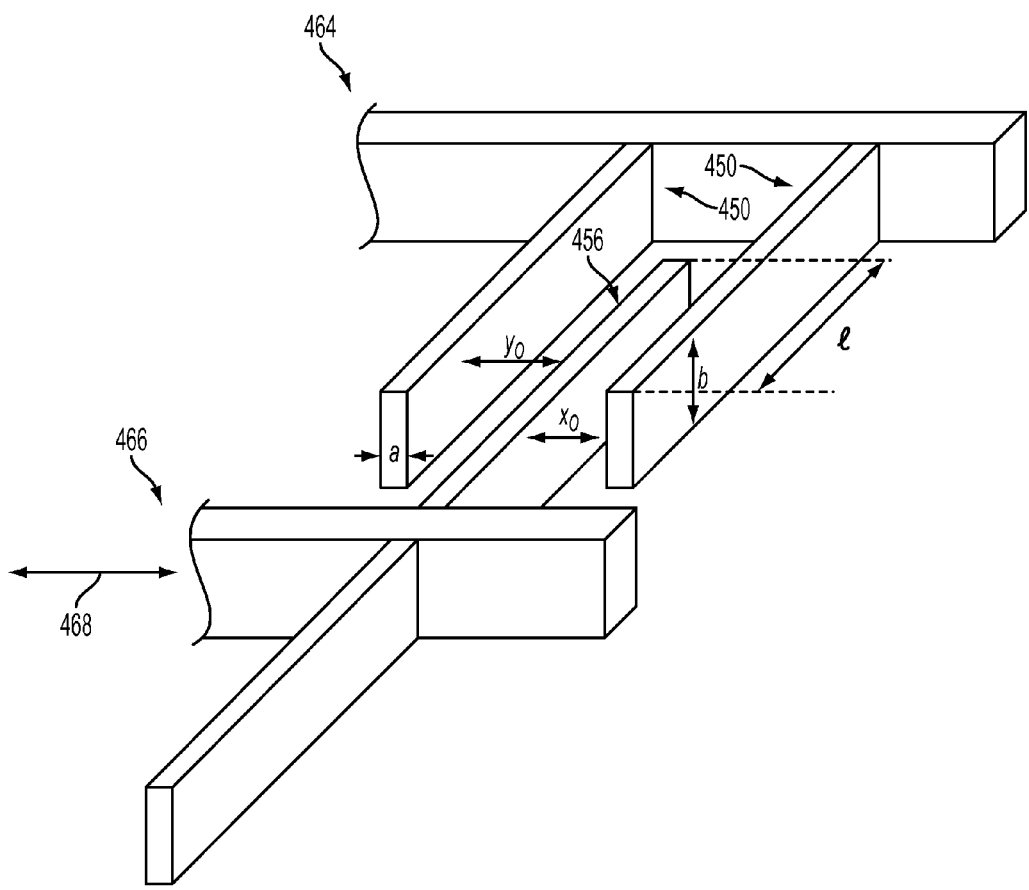

A process for constructing a sub-assembly 100 will now be described in relation to FIGS. 12-21. The figures provide a split view of a concurrent buildup of three different portions of the sub-assembly. In FIGS. 12-21, portions a, b, and c each represent a different cross-section of the sub-assembly in a concurrent build process. Section "a" is a cross-sectional taken along line 12a-12a of a build up of the peripheral wall (e.g. peripheral wall 104). Section b is a cross-section taken along line 12b-12b showing a concurrent build-up of a portion of the exemplary signal processing component 110 in FIGS. 9 and 10a. Section c is a cross-section taken along line 12c-12c showing a concurrent build up of a portion of the exemplary signal processing component 108 as shown in FIGS. 9 and 10b.

As shown in FIG. 12, a first photoresist layer 502 is applied to the upper surface of the substrate 102 so that the exposed portions of the upper surface correspond to the locations at which the conductive material is to be provided. The first photoresist layer is formed, for example, by depositing and patterning photodefinable, or photoresist material on the upper surface of the substrate 102. The first layer of electrically-conductive material 504 is subsequently deposited on the exposed, portions of the substrate 102 to a predetermined thickness. Conductive material layer 504 forms the first layer 604 of peripheral wall 104 at portion a. Conductive material layer 504 also forms respectively the first layer 612 of the center conductor 412, first layer 616 of the conductive windings 416 and the first layer 614 of the component wall 414. Conductive layer 504 also forms the first layer 650 comprising conductive fingers 450. The deposition of the electrically-conductive material is accomplished using a suitable technique such as chemical vapor deposition (CVD). Other suitable techniques, such as physical vapor deposition (PVD), sputtering, or electroplating, can be used in the alternative. The upper surfaces of the newly-formed first layer can be planarized using a suitable technique such as chemical-mechanical planarization (CMP).

Figure 19:
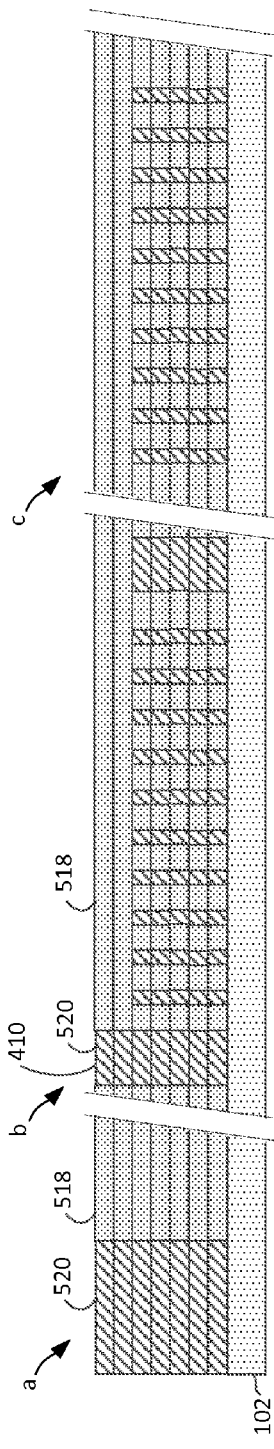

A second layer of photoresist material 506 is deposited and patterned as shown in FIG. 14. Thereafter, a second layer of the electrically conductive material 508 is deposited as shown in FIG. 15 to form a second layer of peripheral wall 104, the center conductor 412, the conductive windings 416, the component wall 414, and conductive fingers 450. The foregoing process of applying photoresist and conductive material layers is iteratively repeated until the structure at FIG. 16 is obtained, which includes third, fourth and fifth layers of peripheral wall 104, center conductor 412, conductive windings 416, component wall 414, and conductive fingers 450. At this point in the process, there are a sufficient number of layers forming the conductive windings 416 and conductive fingers 450. Accordingly, as shown in FIG. 17, a photoresist layer 514 is applied over those portions of the substrate as shown at 630 and 632. The photoresist layer is patterned to leave portions of the substrate exposed at 626, 628 to continue fabricating additional conductive layers forming portions of the peripheral wall 104 and the center conductor 412. Thereafter, as shown in FIG. 18, a sixth layer 516 of electrically-conductive material is subsequently deposited on the exposed portions of the partially constructed device to form additional portions 634, 638 of the peripheral wall 104 and center conductor 412. The foregoing process of depositing photo-resist and conductive material is then repeated using photoresist layer 518 and conductive layer 520 as shown in FIG. 19. The additional conductive layer forms additional portions of the peripheral wall 104 and conductive element 410.

Figure 20:
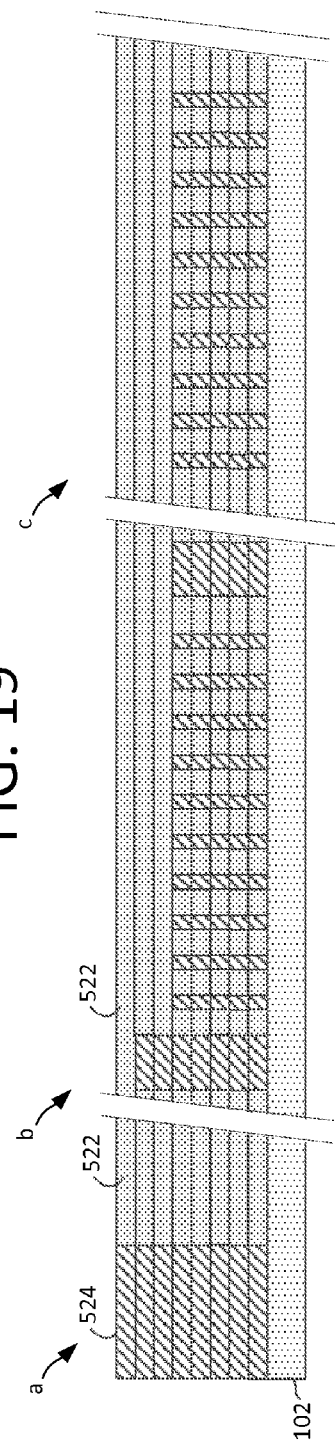
Figure 21:
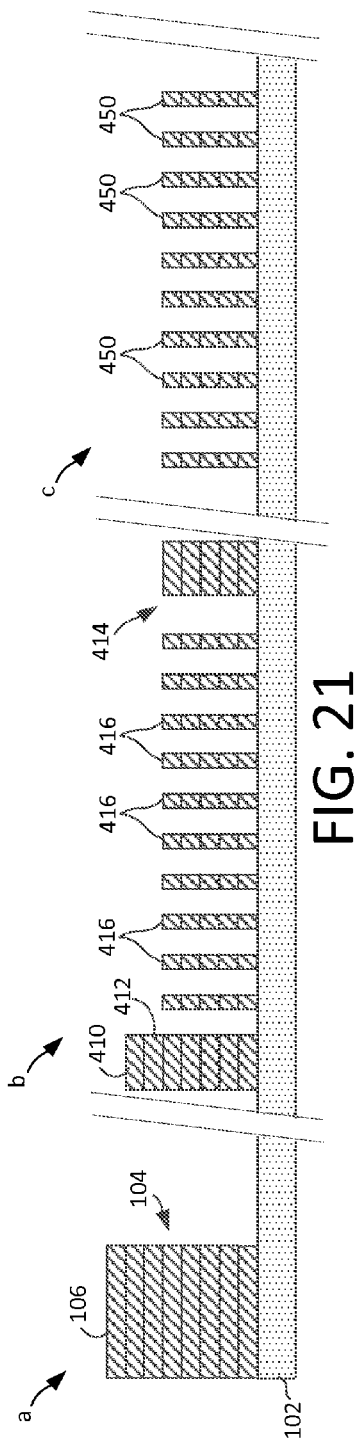

At this point in the process, construction of the signal processing components 108, 110 is complete, but at least one additional layer of conductive material 524 is needed to continue fabricating the peripheral wall 104. Accordingly, as shown in FIG. 20, a further layer of photoresist 522 is applied to the partially-constructed sub-assembly by patterning additional photoresist material in the desired shape of the peripheral wall 104. This step is repeated until a desired peripheral wall height is achieved. After the final layer has been deposited to form the peripheral wall 104 as described herein, the photoresist material remaining from each of the masking steps is released or otherwise removed as depicted in FIG. 21, using a suitable technique such as exposure to an appropriate solvent that dissolves the photoresist material.

From the foregoing it will be understood that the sub-assemblies 100, 200 can include numerous signal processing components formed from layers of conductive material, and that these signal processing components are formed concurrently with the peripheral walls and interconnects as described herein. Further, it will be understood that the signal processing components can include reactive components (including variable reactive components) such as inductors, capacitors, and varactors) and actuator elements which are used to control varactors. The signal processing components can also include MEMS switching devices. The signal processing components can include these and any other type of device now known or known in the future, that can be fabricated using the techniques described herein. These signal processing components are used to form circuits that from various RF subsystems. For example, these signal processing components in some embodiments form monolithically integrated RF filters, including tunable RF filters. When combined with one or more switches, a plurality of switched monolithically integrated tunable RF filter banks is provided. A plurality of sub-assemblies are stacked as described herein to provide a highly integrated RF system which is disposed on only a relatively small area of real estate. Each sub-assembly can be an independent system that can be combined with other sub-assemblies to form more complex systems.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

I claim:

1. A radio frequency system, comprising:
   a first sub-assembly including a first plurality of layers of conductive material disposed on a first surface of a first substrate and arranged in a first stack to form
      at least a first peripheral wall surrounding a first walled area of said first substrate, said first peripheral wall extending a first predetermined distance away from said first surface to form a first ledge, and
      at least one first signal processing component disposed on said first surface of said first substrate within said walled area, and
      at least one first transmission line element disposed on and extending a second predetermined distance away from and in a direction which is normal to said first surface; and
   a second sub-assembly including a second plurality of layers of conductive material disposed on a second surface of a second substrate and arranged in a second stack to form
      at least one second signal processing component disposed within a second walled area, and
      at least one second transmission line element disposed on and extending a third predetermined distance away from and in a direction normal to said second surface;
   wherein said second sub-assembly is suspended on said first ledge of said first sub-assembly with said first walled area aligned with said second walled area;
   wherein an electrical connection is formed directly between the first and second transmission line elements by aligning a central axis of the first transmission line element with a central axis of the second transmission line element and establishing direct electrical contact between abutting ends of the first and second transmission line elements;
   wherein an electrical connection is formed where said first ledge abuts said second ledge and between a first conductive trace disposed on the first substrate and a second conductive trace disposed on the second substrate.

2. The radio frequency system according to claim 1, further comprising at least a second peripheral wall disposed on said second surface surrounding said second walled area.

3. The radio frequency system according to claim 2, wherein said second peripheral wall extends a predetermined distance away from said second surface and forms a second ledge.

4. The radio frequency system according to claim 3, wherein said second ledge is aligned on said first ledge to suspend said second sub-assembly on said first sub-assembly.

5. The radio frequency system according to claim 1, wherein at least one of said first and second signal processing components is selected from the group consisting of a reactive component and a switch.

6. The radio frequency system according to claim 5, further comprising an electrostatic actuator configured to control at least one of said reactive component and said switch.

7. The radio frequency system according to claim 6, further comprising at least one electrical connection between said first and second signal processing components.

8. The radio frequency system according to claim 1, further comprising at least one layer of dielectric material disposed on at least one of said first and second substrate.

9. The radio frequency system according to claim 1, further comprising at least one conductive trace on said substrate extending away from said first surface to form at least a portion of an electrical connection between said first signal processing component and said second signal processing component.

10. The radio frequency system according to claim 1, wherein said second sub-assembly is suspended on said ledge with said first surface spaced apart from said second surface.

11. A radio frequency system, comprising:
- a first sub-assembly including a first plurality of layers of conductive material disposed on a first surface of a first substrate and arranged in a first stack to form
  - at least a first peripheral wall surrounding a first walled area of said first substrate, said first peripheral wall extending a first predetermined distance away from said first surface to form a first ledge, and
  - at least one first signal processing component disposed on said first surface of said first substrate within said walled area, and
  - at least one first transmission line element disposed on and extending a second predetermined distance away from and in a direction which is normal to said first surface;
- a second sub-assembly including a second plurality of layers of conductive material disposed on a second surface of a second substrate and arranged in a second stack to form
  - at least one second signal processing component disposed within a second walled area, and
  - at least one second transmission line element disposed on and extending a third predetermined distance away from and in a direction normal to said second surface;
- at least a second peripheral wall disposed on said second surface surrounding said second walled area; and
- at least a first conductive trace on said first substrate, and at least a second conductive trace on said second substrate, and wherein an electrical connection is formed between said first and second conductive traces where said first ledge abuts said second ledge;
- wherein said second sub-assembly is suspended on said first ledge of said first sub-assembly with said first walled area aligned with said second walled area; and
- wherein an electrical connection is formed directly between the first and second transmission line elements by aligning a central axis of the first transmission line element with a central axis of the second transmission line element and establishing direct electrical contact between abutting ends of the first and second transmission line elements.

12. The radio frequency system according to claim 11, wherein said first and second conductive traces together form at least a portion of an electrical connection between said first signal processing component and said second signal processing component.

* * * * *